United States Patent [19]
Holcombe et al.

[11] Patent Number: 5,635,254
[45] Date of Patent: *Jun. 3, 1997

[54] PLASMA SPRAYING METHOD FOR FORMING DIAMOND AND DIAMOND-LIKE COATINGS

[75] Inventors: Cressie E. Holcombe, Farragut; Roland D. Seals, Oak Ridge; R. Eugene Price, Knoxville, all of Tenn.

[73] Assignee: Martin Marietta Energy Systems, Inc., Oak Ridge, Tenn.

[*] Notice: The term of this patent shall not extend beyond the expiration date of Pat. No. 5,453,303.

[21] Appl. No.: 361,997

[22] Filed: Dec. 21, 1994

Related U.S. Application Data

[63] Continuation-in-part of Ser. No. 3,274, Jan. 12, 1993, abandoned.

[51] Int. Cl.$^6$ ........................ B05D 1/10
[52] U.S. Cl. ............... 427/450; 427/446; 427/122
[58] Field of Search ............... 427/450, 446, 427/122; 423/446

[56] References Cited

U.S. PATENT DOCUMENTS

| | | | |
|---|---|---|---|
| 3,705,937 | 12/1972 | Dzevitsky et al. | 423/446 |
| 4,228,142 | 10/1980 | Holcombe, Jr. et al. | 423/449 |
| 4,767,608 | 8/1988 | Matsumoto et al. | 423/446 |
| 4,842,937 | 6/1989 | Meyer et al. | 428/408 |
| 4,988,421 | 1/1991 | Drawl et al. | 204/192.3 |
| 4,992,082 | 2/1991 | Drawl et al. | 51/295 |
| 5,174,983 | 12/1992 | Snail | 423/446 |
| 5,260,106 | 11/1993 | Kawarada et al. | 427/577 |
| 5,453,303 | 9/1995 | Holcombe et al. | 427/450 |

FOREIGN PATENT DOCUMENTS

| | | |
|---|---|---|
| 0470644 | 2/1992 | European Pat. Off. . |
| 3117993 | 5/1988 | Japan . |
| 1-164795 | 6/1989 | Japan . |
| 3-088707 | 4/1991 | Japan . |
| 3-141193 | 6/1991 | Japan . |

OTHER PUBLICATIONS

"Ceramic Coatings Obtained . . . Thermal Spraying", Guilemany etal., pmi vol.25, No.4, 1993, pp.176–179.
"The HVOF Process", Irving etal., Welding Journal, pp.25–30, Jul. 1993.
"Abrasion Wear Resistance . . . Combustion Processes" Niemi etal., Proceedings of Int'l Thermal Spray Conf & Exp. May 25, 1992–Jun. 5, 1992 No Page Number.
"Thermal Spray:Int'l Advances . . . Technology", Proceedings of Int'l Thermal Spray Conf.& Exp., ASM International, May 28, 1992–Jun. 5, 1992 No Page Number.
"Vitreous Carbon—A New Form of Carbon", Cowlard et al., Journal of Materials Science 2, 1967, pp.507–512.
"Newer Forms of Carbon . . . Uses" Cahn et al. Nature—vol. 221, Jan. 1969 No Page Number.
"The Physical and Chemical . . . Graphite" Tee et al., Journal of Chemical Education—vol. 40, No. 3, Mar. 1963 pp. 117–122.

(List continued on next page.)

*Primary Examiner*—Roy V. King
*Attorney, Agent, or Firm*—Martin J. Skinner; Ivan L. Ericson; Harold W. Adams

[57] ABSTRACT

A method and composition for the deposition of a thick layer (10) of diamond or diamond-like material. The method includes high temperature processing wherein a selected composition (12) including at least glassy carbon is heated in a direct current plasma arc device to a selected temperature above the softening point, in an inert atmosphere, and is propelled to quickly quenched on a selected substrate (20). The softened or molten composition (18) crystallizes on the substrate (20) to form a thick deposition layer (10) comprising at least a diamond or diamond-like material. The selected composition (12) includes at least glassy carbon as a primary constituent (14) and may include at least one secondary constituent (16). Preferably, the secondary constituents (16) are selected from the group consisting of at least diamond powder, boron carbide ($B_4C$) powder and mixtures thereof.

13 Claims, 5 Drawing Sheets

OTHER PUBLICATIONS

"Cubic BN: Handbook of Properties" DeVries, GE Comp. R&D, Jun. 1972 No Page Number.

"Physical Prop. of Diamond" Chrenko etal. GE Comp. R&D, Physical Chemistry Lab, Oct. 1975 No Page Number.

"Metals Handbook" 9th Edition, vol. 7, Powder Metallurgy, ASM 1984 No Page Number.

"Properties of Diamond" DeBeers Industrial Diamond Division No Year, Month and Page Number.

"Deposition of Diamondlike . . . Plasma" NASA Tech Briefs, Oct. 1991 p.42.

"Glassy Carbon . . . Chemistry" Dubgen, Sigri Corp. Publication.

"Electroplating Eng. HB" Graham, 1971. Litton Ed. Pub. Inc. No Page Number.

"Metals HB 9th Ed." vol. 5, Surface Cleaning . . . Coating, ASM HB Comm. '82, pp. 532–457.

"Single-Crystal . . . Carbon" Whittaker et al., Journal American Ceramic Society, vol. 57, No.10, pp. 443–446, Oct. 1974.

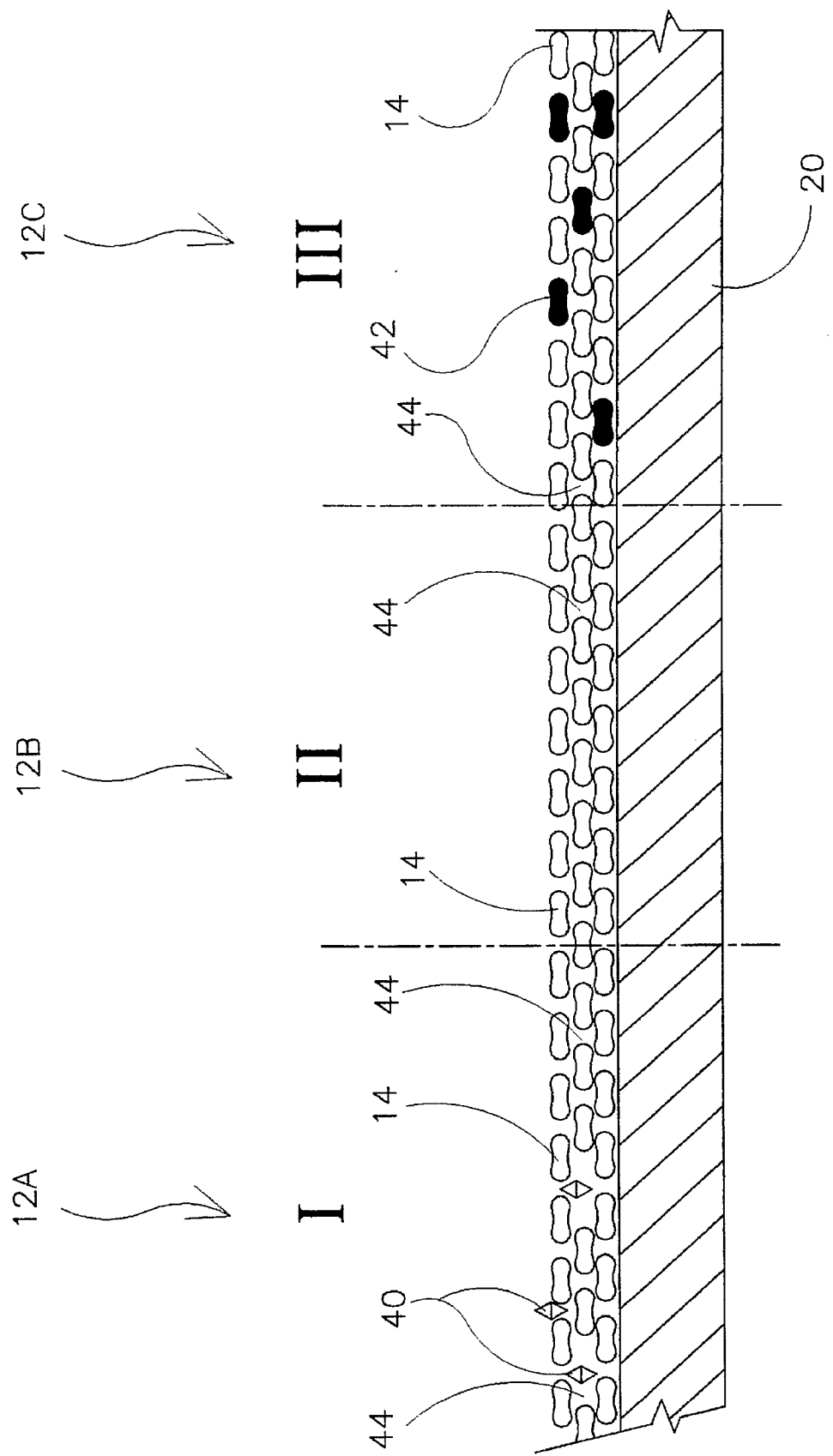

PLASMA SPRAYING METHOD FOR FORMING DIAMOND AND DIAMOND-LIKE COATINGS

This invention was made with Government support under Contract No. DE-AC05-84OR21400 awarded by the U.S. Department of Energy to Martin Marietta Energy Systems, Inc. and the Government has certain rights in this invention.

This is a continuation-in-part patent application based upon parent U.S. patent application Ser. No. 08/003,274 filed Jan. 12, 1993, now abandoned.

TECHNICAL FIELD

This invention relates to the field of diamond formation and more particularly to diamond coating deposition. More specifically, this invention relates to the formation of diamond by conversion of glassy carbon and glassy carbon mixtures through a transformation from a softened or molten state, and to the deposition of thick layers of diamond and diamond-like materials by the method heating powders of the feed materials in an inert atmosphere within a plasma spray device, and propelling the heated feed material onto a substrate.

BACKGROUND ART

It is well known that the use of diamond coatings offers many advantages in several fields of use. Diamond coated saws and drills are used to cut concrete and steel. Drill bits coated with a thin layer of diamond may be used at much higher rotational velocities with much greater efficiency than standard drill bits. In the field of surgery, some procedures require ultra-sharp scalpels coated with a thin diamond film.

It is well known that the advantages given by diamond coated tools are due mainly to the physical characteristics of the diamond. Namely, diamonds exhibit low expansion when heated and have a high degree of hardness and heat conductivity. Diamond also has a low coefficient of friction.

The deposition of thin diamond coatings has been taught by others. Typically, thin films are only a few Angstroms to 1 micron thick. Typical of the art are those devices disclosed in the following patents:

| Patent No. | Inventor | Date |
| --- | --- | --- |
| US 4,767,608 | Matsumoto et al. | Aug. 30, 1988 |
| US 4,842,937 | Meyer, et al. | June 27, 1989 |
| US 4,988,421 | Drawl, et al. | Jan. 29, 1991 |
| US 4,992,082 | Drawl, et al. | Feb. 12, 1991 |
| US 5,174,983 | Snail | Dec. 29, 1992 |
| US 5,260,106 | Kawarada et al. | Nov. 9, 1993 |
| EP 0,470,644 | Bigelow | Feb. 12, 1992 |
| JP 3,141,193 | Kurihara | Oct. 24, 1989 |
| JP 88,707 | | Apr. 15, 1991 |
| JP 117,993 | | May 21, 1988 |
| JP 164,795 | | June 25, 1989 |

The Meyer patent ('937) discloses multilayer deposition on the surface of a cutting tool, the layers varying in composition from the first layer to the last. The Meyer patent does not disclose the deposition of a single thick layer of a diamond or diamond-like material on a selected substrate.

The Drawl patents ('421 and '082), the latter being a divisional of the former, describe a process of toughening diamond or diamond-like coatings through the use of chemical vapor deposition (CVD). In the Drawl process, a plurality of layers of diamond or diamond-like particles is deposited with a layer of mechanically adherent, planarized binding material being interposed between each respective pair of diamond or diamond-like layers.

Kurihara discloses a method of manufacturing a diamond film by applying a coat of thick film paste composed of diamond particles and metallic powder. The thick film is then baked in an inactive gas atmosphere to form a middle layer of diamond particles and metal. This middle layer is then polished. The substrate is then mounted in a DC plasma gas phase growth device and subjected to hydrogen gas containing carbon gas to attain gas phase growth of the diamond.

Each of the Drawl patents and the Kurihara application disclose the use of CVD, which requires the use of a chamber in which the diamond growth occurs. In some applications of diamond coatings, it may be desirable to be able to produce the diamond film in the field where facilities for CVD are unavailable. Such a method may include a DC arc plasma. Though Kurihara employs a DC plasma, it is used there in conjunction with a CVD device.

The European patent ('644) issued to Bigelow uses DC arc assisted plasma deposition to form a multi-layer film, each layer being fabricated from similar chemical compositions. The individual layers of diamond may be separated by a thin layer of graphite.

It is well known that each layer adds to the complexity of the manufacture of the film. Therefore, it is desirable to manufacture a thick film of diamond or diamond-like material on a selected substrate wherein the thick film consists of a single layer.

The Matsumoto et al, Snail and Kawarada et al references are all directed to a vapor-phase system, and thus to a type of CVD process. This is also true of the '993 and '759 Japanese patent references. The '707 Japanese patent reference teaches the formation of diamond particles by irradiating glassy carbon that was deposited on a surface, the diamond particles being scattered from that surface. Further, there is a teaching that the process occurs at a relatively low pressure—in contrast to atmospheric pressure.

Therefore, it is an object of this invention to provide a means for depositing a single thick layer of diamond or a diamond-like film over a selected portion of a selected substrate.

It is also an object of the present invention to provide a means whereby a thick diamond film may be deposited in a selected environment not requiring the use of a deposition chamber and, therefore, the coating can be applied at normal atmosphere pressure.

Still another object of the present invention is to provide a means for depositing a thick diamond or diamond-like film using a DC plasma torch wherein powders are heated to at lease a softened state in an inert atmosphere and propelled against a substrate where the diamond coating is produced by transformation when the heated powder is quenched.

DISCLOSURE OF THE INVENTION

Other objects and advantages will be accomplished by the present invention which provides for the method and composition for the deposition of a thick layer of diamond or diamond-like material. In the present invention, a direct current plasma arc is used to heat a selected powder in an inert atmosphere and to propel that heated composition onto a selected substrate in order to obtain the thick deposition layer. Deposition layers of greater than about five microns and up to 3 mils, approximately equal to 76 microns, have been obtained by implementation of the present invention. Of course, thicker coatings can be obtained by continuing the deposition for longer times.

The deposition of the present invention is accomplished by the high temperature processing of a selected composition of particles, a substantial portion of which are in selected carbon phases. Preferably, the primary component of the composition is in a vitreous carbon, or glassy carbon, state. The composition may further comprise secondary particles including, but not limited to, diamond powder and boron carbide ($B_4C$).

The high temperature processing method used to obtain the thick deposition layers is a plasma spray process, wherein a plasma gas stream heats and propels the selected mixture of particles onto the selected substrate. The composition, upon being introduced into a plasma stream, is heated in the presence of an inert gas to a selected temperature, generally softening or melting the material. The softened or molten material is then propelled toward the selected substrate where it is quenched, and thus hardened. The diamond coating forms by transformation during this quenching. The plasma spray gun is moved along the surface of the selected substrate in order to obtain the thick deposition layer over any selected area.

BRIEF DESCRIPTION OF THE DRAWINGS

The above mentioned features of the invention will become more clearly understood from the following detailed description of the invention read together with the drawings in which:

FIG. 9 is a drawing depicting a typical cross-sectional view of a selected substrate after the application of three selected compositions of the present invention.

BEST MODE FOR CARRYING OUT THE INVENTION

A method and composition for the deposition of a thick layer of diamond or diamond-like material achieved by various features of the present invention, the thick deposition layer being illustrated generally at 10 in the figures. The thick deposition layer 10 of diamond or diamond-like material may be used to coat selected substrates to obtain high degrees of hardness and heat conductivity and low degrees of friction. The method of depositing the thick layer 10 of diamond or diamond-like material of the present invention may be performed in the field as well as in the laboratory for it does not require use of a controlled atmosphere, e.g., a deposition chamber. Deposition layers 10 of a few (e.g., five) microns up to 3 mils, approximately equal to 76 microns, have been obtained by implementation of the present invention, which is a substantial increase as compared to the 1 micron layers available from the prior art previously disclosed. The upper limit of thickness solely depends upon the elapsed time of the deposition.

It will be understood that any reference to "diamond" or "diamond-like material" as an element of the deposition layer, unless otherwise noted, refers to any diamond or material exhibiting the same properties as diamond including the same spectrographic "signature".

Figure 2:
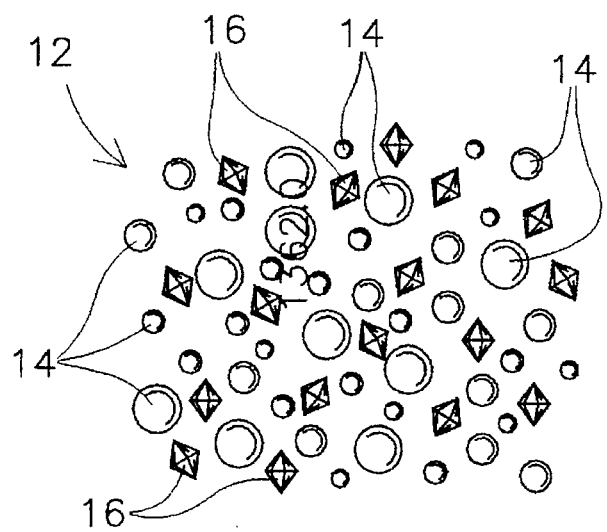
FIG. 2 illustrates a selected composition used in accordance with the present invention.

The deposition of the present invention is accomplished by the high temperature processing of a selected composition 12 of particles, a substantial portion of which are in selected carbon phases (see FIG. 2). Preferably, a primary portion 14 of the particles are in a vitreous carbon, or glassy carbon, state. The composition 12 may further comprise secondary particles 16 including, but not limited to, diamond powder, boron carbide ($B_4C$) and mixtures thereof. Tests have shown that a composition 12 of one hundred percent (100%) glassy carbon has yielded a thick deposition layer 10 of substantially 100% diamond material, as has a composition 12 of fifty volume percent (50 vol. %) glassy carbon and fifty volume percent (50 vol. %) diamond powder. A composition 12 of ninety volume percent (90 vol. %) glassy carbon and ten volume percent (10 vol. %) $B_4C$ has yielded a thick deposition layer 10 of diamond material and $B_4C$. The thick deposition layer 10 yielded from the glassy carbon/$B_4C$ composition 12 yields a greater amount of diamond than does glassy carbon alone. These results are to be described more fully below.

It follows from the positive results obtained from the above compositions that the compositions 12 containing diamond powder and $B_4C$ particles may be varied to increase or reduce the diamond powder and $B_4C$ particles while still attaining favorable results. Thus, compositions other than only a 50/50 composition 12 of glassy carbon/diamond or a 90/10 composition 12 of glassy carbon/$B_4C$ can be utilized.

Figure 1:
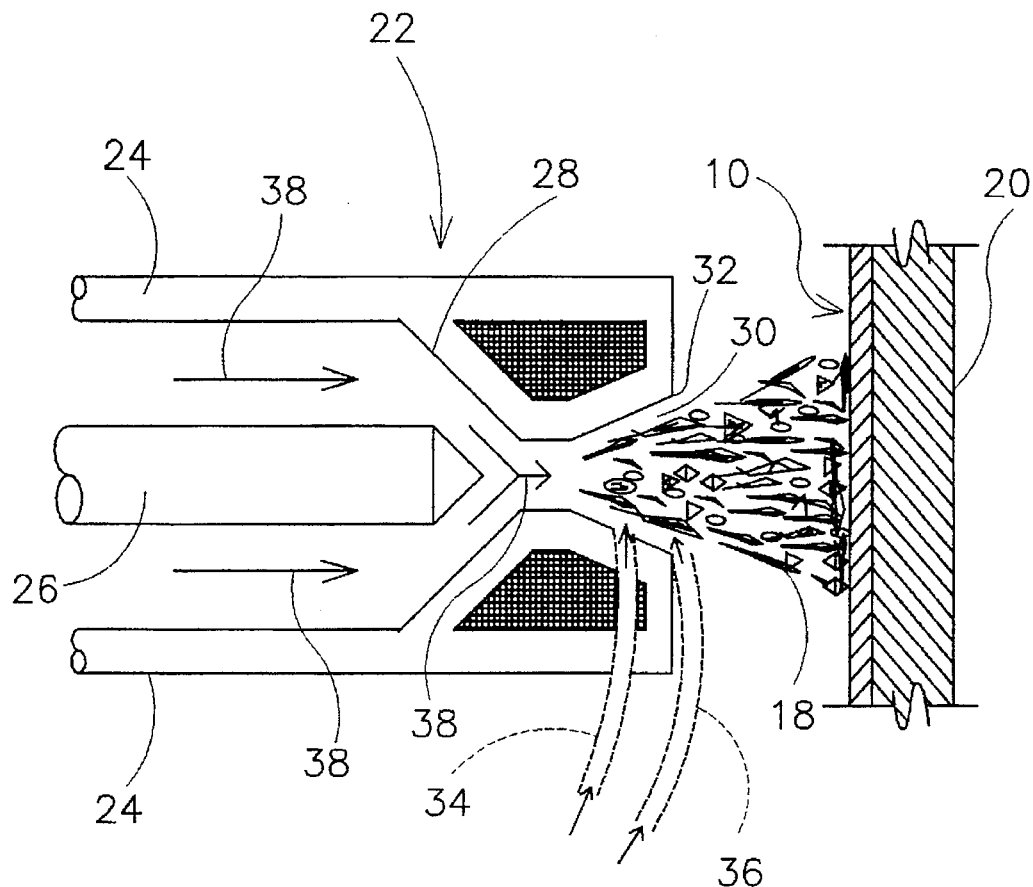
FIG. 1 is a schematic diagram of a conventional plasma spray gun used in accordance of the present invention to obtain a thick deposition of diamond material.

The high temperature processing method used to obtain the thick deposition layers 10 from the above-mentioned compositions 12 is a plasma spray process, wherein an inert plasma gas stream 38 heats and propels the selected composition 12 of particles onto the selected substrate 20. As shown in FIG. 1, the plasma spray process employs a conventional plasma spray gun 22 through which a heated inert gas (plasma) is sprayed. The heated gas may include argon, nitrogen, hydrogen, or any other gas that does not have a tendency to cause reactions. In the preferred embodiment, argon is used as the primary gas, helium as the secondary gas, and argon as the carrier gas.

In the plasma spray gun 22 depicted, the gas flows through an anode 24, such as a water-cooled copper anode. The anode 24 also serves as a constricting nozzle 28. A rear electrode 26, fabricated from a material such as tungsten, serves to internally maintain a plasma-producing arc.

The selected composition 12 of particles may be introduced to the plasma stream 38 at a selected location. Typically, the composition is introduced through an inlet 34 in the diverging portion 30 of the nozzle Alternately, the composition can be introduced through an inlet 36 immediately beyond the nozzle outlet 32. The selection of the specific inlet will depend upon the desired duration of exposure to the plasma spray 38. Obviously, the sooner the composition is introduced into the plasma spray 38, such as through inlet 34, the longer the composition will be in contact with the plasma spray and thus the composition will achieve higher temperatures, while holding all other variables constant. In the preferred embodiment, the composition 12 is introduced through the inlet 36 at the nozzle outlet 32, thereby minimizing the heating of the particles.

Other variables to be considered in heating the composition 12 to a selected temperature include, but are not limited to: the feed rates of the primary, secondary, and carrier gases into the plasma spray gun 22; the feed rate of the composition into the plasma spray 38; the particle size of the composition 12; and the geometrical shape of the individual particles within the composition 12. In the preferred embodiment, the respective feed rates of the primary, secondary, and carrier gases are 15–30 Standard Cubic Feet per Hour (SCFH), 10–20 SCFH, and 10–40 SCFH. These feed rates are indicative that no enclosure is required.

The composition 12, upon being introduced into the plasma stream 38, is heated to a selected temperature as indicated, at which point it is softened or melted. Typically, this temperature may reach 2000 to 2500° C., while the temperature of the plasma spray 38 may be greater than 30,000° K. The softened or molten material 18 is then propelled toward the selected substrate 20 by action of the plasma spray device. The propelled material 18 is quenched, and thus hardened, upon contact with the selected substrate 20. This causes the softened or molten material to form the diamond or diamond-like material by a transformation. The plasma spray gun 22 is being moved along the surface of the selected substrate 20 in order to obtain the thick deposition layer 10.

As a means for testing the results of various depositions, Raman spectroscopy may be used. Raman spectroscopy, which is the most accurate diamond analysis method, is known to rapidly distinguish between diamond and graphite, which are two forms of carbon. Raman spectroscopy measures light wavelengths versus counts per second. Peaks at the various wavelengths denote the presence of a particular carbon form.

Figure 3:
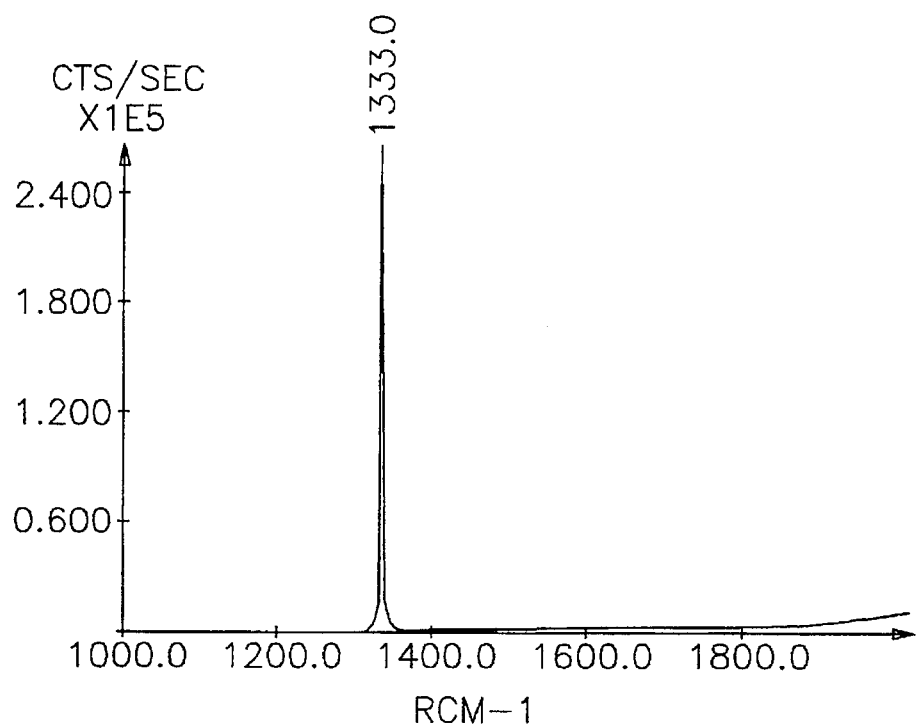
FIG. 3 is a Raman spectrograph of a standard diamond sample.
Figure 4:
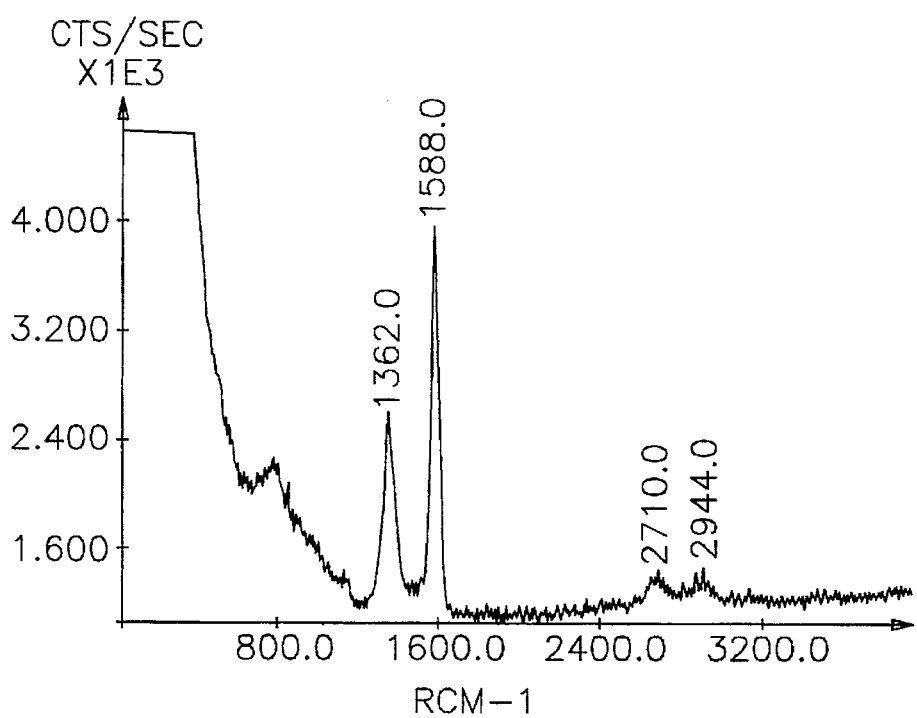
FIG. 4 is a Raman spectrograph of a standard graphite sample.

FIG. 3 illustrates a Raman spectrograph of a sample of diamond as a standard. A definite peak occurs at 1333.0 reciprocal centimeters (RCM). Peaks at approximately 1333.0 RCM will thus denote the presence of diamond in any coating deposited by the present invention. Similarly, FIG. 4 illustrates a Raman spectrograph of a sample of graphite as a standard. Definite peaks occur at 1362.0 and 1588.0 RCM while subtle peaks occur at 2710.0 and 2944.0 RCM. Thus similar peaks at these wavelengths in a spectrographic analysis will denote the presence of graphite in the respective forms in any coating deposited by the present invention. The spectrographs of FIGS. 3 and 4 resulted from the spectroscopy of samples which had not been processed, thus giving a tool for defining the composition of a deposition accomplished from the method taught by the present invention.

Figure 5:
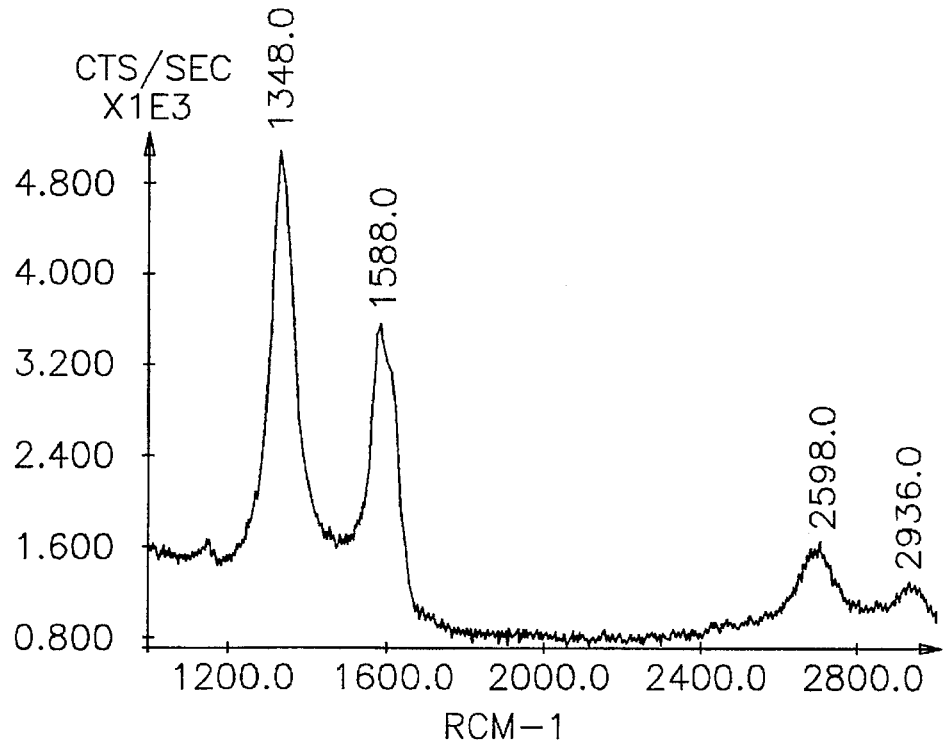
FIG. 5 is a Raman spectrograph of a thick deposition layer yielded from a primary component of glassy carbon using several features of the present invention.

As discussed previously, a variety of compositions 12 may be used to obtain a thick deposition layer be of diamond material. In the preferred composition 12 used in the present invention, a primary component 14 such as glassy carbon is included. One or more selected secondary components 16 may be added to effect and enhance the diamond yield. The method herein disclosed has been employed using substantially one hundred percent (100%) glassy carbon, yielding a deposition layer consisting of only diamond under certain controlled conditions, and of only pure glassy carbon under other certain controlled conditions. FIG. 5 is the Raman spectrum of a thick layer deposition of glassy carbon; i.e., pure glassy carbon without any graphite (as shown in FIG. 4) being detected.

Many organic materials in an inert environment convert to glassy carbon. Therefore, it is foreseeable that any organic material which forms glassy carbon might be introduced into the plasma spray 38, the organic material being converted to glassy carbon and then to diamond. Specific examples of such precursors to glassy carbon, include furan resin and phenolic resin. These resins may be used in lieu of glassy carbon. Precursors to glassy carbon dissociate normally to glassy carbon prior to being converted to diamond by the method of this invention.

Figure 6:
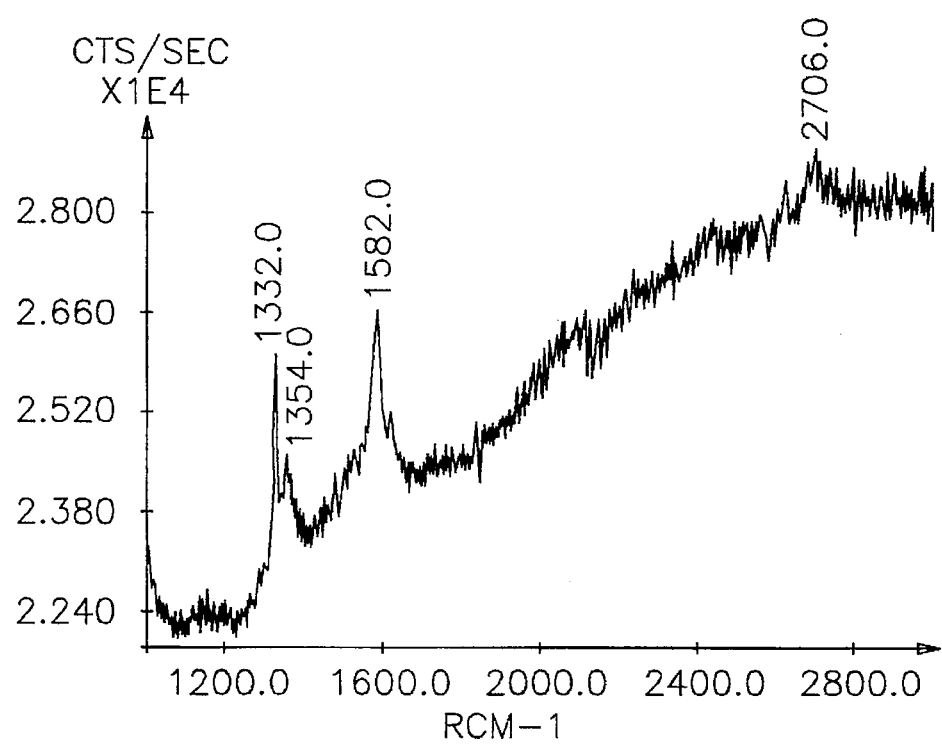
FIG. 6 is a Raman spectrograph of a yield from a primary component of diamond powder using several features of the present invention.
Figure 7:
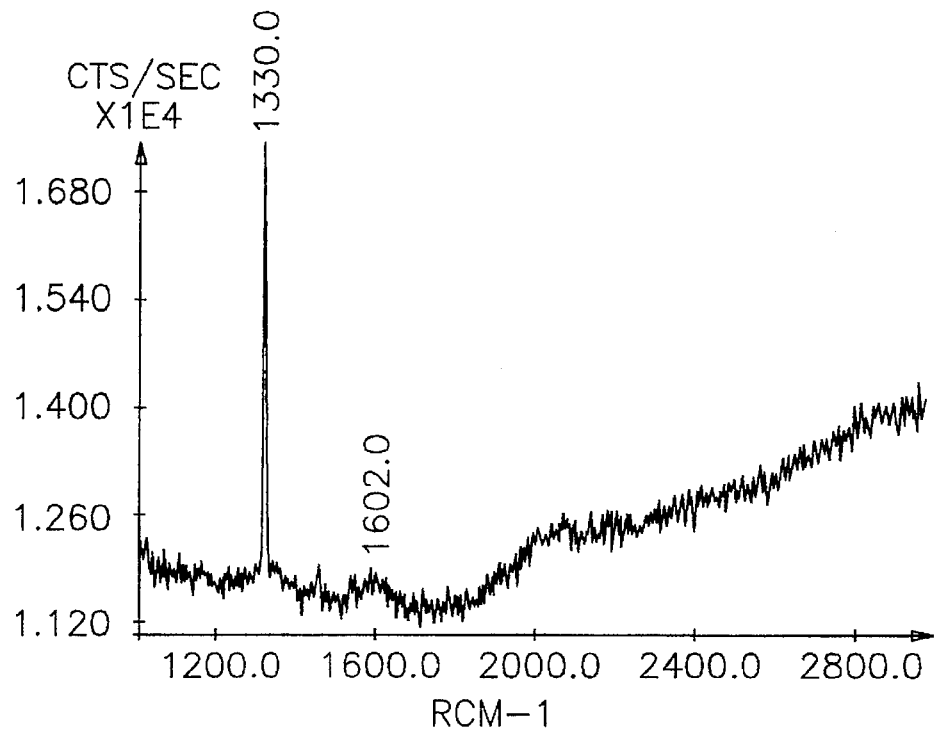
FIG. 7 is a Raman spectrograph of a thick deposition layer yielded from a primary component of glassy carbon and a secondary component of diamond powder using several features of the present invention.

At least one secondary component 16 may be mixed with the primary component 14 in order to enhance the diamond yield. One preferred secondary component 16 is diamond powder. However, diamond powder used as a primary component 14 may not yield a suitable deposition. FIG. 6 shows the Raman spectrum of a thick layer deposition from plasma spraying of diamond powder. The spectrum shows diamond at 1332 cm$^{-1}$ (similar to FIG. 3) and graphite at 1354 cm$^{-1}$ and 1582 cm$^{-1}$ (similar to FIG. 4). This sample is mostly diamond as shown by the Raman spectrum, Raman spectroscopy being approximately fifty-five (55) times more sensitive to graphite than diamond. However, as shown in FIG. 7, a composition 12 of fifty volume percent (50 vol. %) glassy carbon and fifty volume percent (50 vol. %) diamond powder yields a deposition substantially comprised of only diamond. FIG. 2 illustrates the composition 12 of glassy carbon and diamond powder. The glassy carbon 14 is illustrated as spheroids, while the diamond particles 16 are shown as prisms. Comparing FIG. 7 to FIGS. 5 and 6, it is obvious that a much greater yield is obtained when adding diamond powder as a secondary component 16. The peak at 1330.0 RCM is similar to the peak at 1333.0 RCM in FIG. 3, which confirms that the main constituent is diamond. From the comparisons of the various compositions 12 thus far described, it is evident that the secondary component 16 (diamond powder) acts as a promoter in the crystallization of the thick deposition layer be of diamond material.

Figure 8:
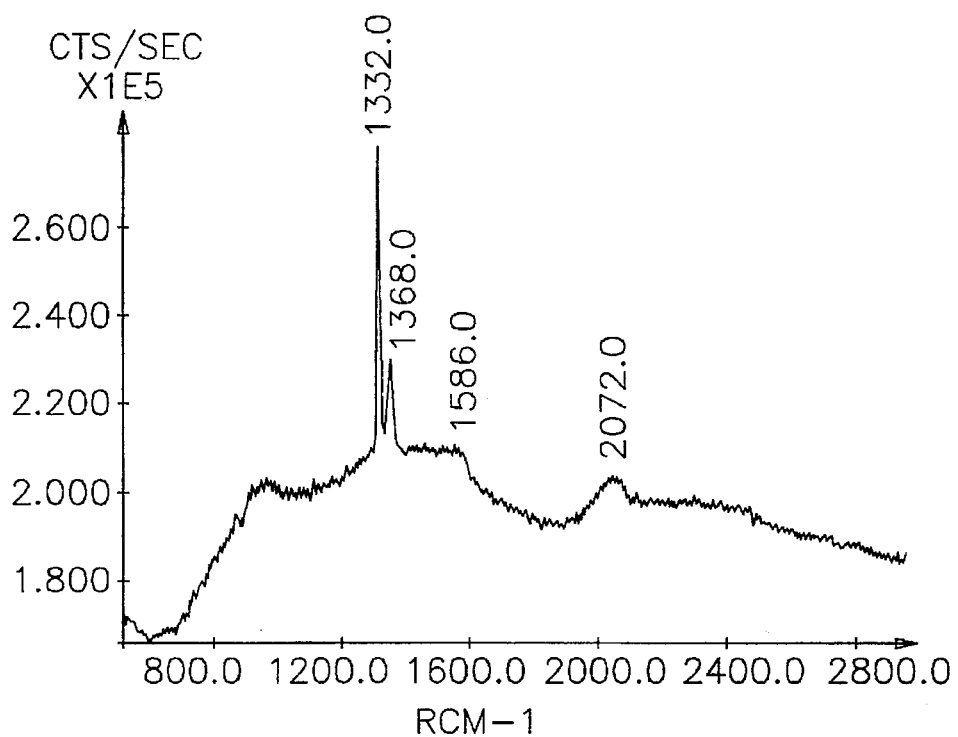
FIG. 8 is a Raman spectrograph of a thick deposition layer yielded from a primary component of glassy carbon and a secondary component of boron carbide using several features of the present invention.

Another preferred secondary component 16 is boron carbide ($B_4C$). FIG. 8 illustrates a Raman spectrograph of a deposition layer 10 obtained from a composition 12 of ninety volume percent (90 vol. %) glassy carbon and ten volume percent (10 vol. %) $B_4C$. Diamond is confirmed present by the peak at 1333.0 RCM. Also present are boron nitride (BN), at 1368.0 RCM, and $B_4C$, at 2072.0 RCM. No other forms of carbon are detectable in any quantity. It is evident, again, that the secondary component 16 ($B_4C$) acts as a promoter for the crystallization of the glassy carbon into diamond.

In either of the compositions 12 wherein a secondary component 16 is used, it follows that organic materials or precursors to glassy carbon may be used in lieu of or in addition to glassy carbon. It is foreseeable that materials other than those discussed may be used as primary and/or secondary components 14,16. It is also envisioned that more than one secondary component 16 may be used simultaneously, e.g., diamond powder together with boron carbide powder. Therefore, it is not the intention of this disclosure to limit the primary component 14 to glassy carbon, nor the secondary component 16 to diamond powder or $B_4C$.

As discussed previously, the particulate size of the composition 12 affects the softening or melting time thereof, and thus affects the efficiency of the heating source. It has been found, using the preferred compositions herein described with conventional equipment, that particles defining diameters of approximately 25 to 75 microns have yielded maximum results. Particles finer than 20–25 microns tend to disintegrate while particles coarser than 75 microns will not soften or melt quickly enough and will thus bounce off of the substrate 20, causing a ricocheting effect. It is foreseeable, with varying equipment and compositions, that suitable particle sizes may vary.

The selected composition 12 is applied to a selected substrate 20 in the manner herein described. In the preferred embodiment, the substrate 20 is fabricated from tantalum. Tantalum offers several advantages over other substrates 20. For instance, tantalum has ductile properties. Tantalum also allows for the formation of tantalum carbide on the surface between the substrate 20 and the deposition layer 10 which may aid in the crystallization of diamond. It is foreseeable that other substrates 20 may be used, and the substrate 20 is therefore not intended to be limited to tantalum. It is also foreseeable that a coating of tantalum (or equivalent) may be applied to a selected substrate of another material that may otherwise be unreceptive to the application of a diamond/diamond-like deposition layer 10 by the methods of the present invention.

FIG. 9 illustrates a cross-sectional view of a selected substrate 20 to which several selected compositions 12 have been applied. In Region I, a selected heated composition 12A comprising a primary component 14 of glassy carbon and a secondary component 16 of diamond powder 40 has been applied to the substrate 20. The selected composition 12A is converted to 100% diamond; i.e., no glassy carbon or graphite is detected. In Region II, a selected heated composition 12B of primarily glassy carbon has been applied to the substrate 20 resulting in 100% diamond. Finally, In Region III, a selected heated composition 12C including a primary component 14 of glassy carbon and a secondary component 16 of $B_4C$ 42 has been applied to the substrate 20. The selected composition 12C is converted to a diamond-$B_4C$ composite; i.e., no glassy carbon or graphite is detected. In each of the compositions 12A,B,C, the glassy carbon is crystallized into the diamond structure. In each of the Regions I, II, and III, the resultant coating defines a very small crystallite size.

In each of the selected compositions 12, the glassy carbon 12 is heated such that it becomes malleable and sticky such that upon impact with the substrate, the individual particles build one on the other. During quenching, the transformation of these materials forms the diamond. In Region I, the diamond crystals 40 remain substantially unaltered, while in Region III, the $B_4C$ 42 transitions similarly to the glassy carbon. Upon impact with the substrate 20, the at-least softened glassy carbon 14 and $B_4C$ 42 particles deform to a substantially flat shape and physically adhere one to the other. In the composition 12A, the at-least softened glassy carbon particles 14 are bonded to the diamond particles 40. With the exception of the material make-up of the glassy carbon 4 and the $B_4C$ 42, the appearance of the two are substantially similar.

A coating porosity is defined by each of the illustrated selected compositions 12. As shown, pores 44 are defined between the individual particles of each of the compositions 12. Typically, the pores 44 combine to define a coating porosity in the range of five to thirty percent (5%–30%).

The selected substrates 20 may include the exterior surfaces of tools such as drill bits and saws. They may also include surfaces such as the nose of an orbital aircraft to reduce the effects of reentry into the earth's atmosphere.

Thick deposition layers 10 of diamond offer many advantages in the field of optics. Namely, diamond defines a high index of refraction, a low chemical reactivity, a high degree of hardness, a low coefficient of friction, a large bandgap, a low sensitivity to temperature and radiation damage, a low coefficient of thermal expansion, and a density of approximately 3.5 g/cc. Such properties lend the use of thick deposition layers 10 of diamond to such applications as hard coatings for lenses, x-ray optical elements, and IR optical elements, and in the field of lasers. Diamond coatings are also inert to space dust that deteriorates conventional mirrors and other structures, therefore lending toward the use thereof for window and mirror coatings in outer space. Many other applications for the deposition of a thick layer 10 of diamond or diamond-like material are anticipated other than those described.

From the foregoing description, it will be recognized by those skilled in the art that a method and composition for depositing thick layers of diamond-like materials offering advantages over the prior art has been provided. Specifically, the method and composition for depositing thick layers of diamond-like materials as disclosed enables the deposition of layers of diamond or diamond-like materials defining thicknesses of a few microns (e.g., five) up to at least 76 microns. As compared to the thicknesses of deposition layers obtained by conventional methods—namely, 1 micron—the deposition layers obtained from the method and composition of the present invention are a substantial increase over the prior art. The deposition does not require an enclosure and, thus, can be accomplished in the normal environment.

While a preferred embodiment has been shown and described, it will be understood that it is not intended to limit the disclosure, but rather it is intended to cover all modifications and alternate methods falling within the spirit and the scope of the invention as defined in the appended claims and their equivalents.

We claim:

1. A method for forming a diamond/diamond-like coating upon a substrate, said method comprising the steps of:
    heating a powder composition in an inert atmosphere to a temperature of about 2000° to about 2500° C. by passing said powder composition through a direct current plasma spray device, said powder composition having glassy carbon as a primary component;
    propelling said heated powder composition with said plasma spray device against a surface of said substrate; and
    quenching said heated powder composition on said surface of said substrate to produce said diamond/diamond-like coating on said surface of said substrate.

2. The method of claim 1, after the step of propelling said heated powder composition against said surface of said substrate, further comprising the step of moving said plasma spray device relative to said surface of said substrate to distribute said diamond/diamond-like coating on said surface of said substrate.

3. The method of claim 1 wherein said powder composition includes at least one secondary component selected from the group consisting of diamond powder, boron carbide powder and combinations thereof.

4. The method of claim 1 wherein said powder composition has a particulate size of about 25 to about 75 microns.

5. The method of claim 1 wherein at least said surface of said substrate is fabricated from tantalum.

6. The method of claim 3 wherein said powder composition comprises about fifty volume percent glassy carbon powder and about fifty volume percent diamond powder.

7. The method of claim 3 wherein said powder composition comprises about ninety volume percent glassy carbon powder and about ten volume percent boron carbide powder.

8. A method for forming a diamond/diamond-like coating upon a substrate, said method comprising the steps of:

heating a powder composition in an inert atmosphere to a temperature of about 2000° to about 2500° C. by passing said powder composition through a direct current plasma spray device, said powder composition having glassy carbon as a primary component;

propelling said heated powder composition with said plasma spray device against a surface of said substrate;

moving said plasma spray device relative to said surface of said substrate to distribute said heated powder composition on said surface of said substrate; and quenching said heated powder composition on said surface of said substrate to produce said diamond/diamond-like coating on said surface of said substrate.

9. The method of claim 8 wherein said powder composition includes at least one secondary component selected from the group consisting of diamond powder, boron carbide powder and combinations thereof.

10. The method of claim 8 wherein said powder composition has a particulate size of about 25 to about 75 microns.

11. The method of claim 8 wherein at least said surface of said substrate is fabricated from tantalum.

12. The method of claim 9 wherein said powder composition comprises about fifty volume percent glassy carbon powder and about fifty volume percent diamond powder.

13. The method of claim 9 wherein said powder composition comprises about ninety volume percent glassy carbon powder and about ten volume percent boron carbide powder.

* * * * *